(12) United States Patent
Han et al.

(10) Patent No.: US 9,413,370 B2
(45) Date of Patent: Aug. 9, 2016

(54) ANTI PROCESS VARIATION SELF-ADJUSTABLE ON-CHIP OSCILLATOR

(71) Applicant: Zhejiang University, Hangzhou (CN)

(72) Inventors: Yan Han, Hangzhou (CN); Yuji Qian, Hangzhou (CN); Shifeng Zhang, Hangzhou (CN); Jun Sun, Hangzhou (CN); Xiaopeng Liu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 14/832,155

(22) Filed: Aug. 21, 2015

(65) Prior Publication Data

US 2015/0365096 A1    Dec. 17, 2015

Related U.S. Application Data

(63) Continuation of application No. PCT/CN2014/071614, filed on Jan. 28, 2014.

(30) Foreign Application Priority Data

Jul. 30, 2013   (CN) .......................... 2013 1 0326307

(51) Int. Cl.
*H03K 3/023* (2006.01)
*H03L 7/24* (2006.01)
(Continued)

(52) U.S. Cl.
CPC ........ *H03L 7/24* (2013.01); *H03K 3/011* (2013.01); *H03K 3/0315* (2013.01)

(58) Field of Classification Search
CPC ... H03K 3/0231; H03K 3/0315; H03K 3/011; H03L 7/24

USPC ........................................... 331/111, 143, 57
See application file for complete search history.

(56) References Cited

U.S. PATENT DOCUMENTS

| 4,801,894 A |   | 1/1989 | Garner |
|---|---|---|---|
| 5,276,356 A | * | 1/1994 | Shirotori ................ H03K 3/011 326/21 |

(Continued)

FOREIGN PATENT DOCUMENTS

| CN | 1135118 | 1/2004 |
|---|---|---|
| CN | 1508965 A | 6/2004 |

(Continued)

OTHER PUBLICATIONS

International Search Report issued May 6, 2014 in International Application PCT/CN2014/071614.

*Primary Examiner* — Joseph Chang
(74) *Attorney, Agent, or Firm* — Pillsbury Winthrop Shaw Pittman LLP

(57) ABSTRACT

An anti process variation self-adjustable on-chip oscillator has been disclosed according to the present invention. The on-chip oscillator includes the following components integrated on a same chip: a reference oscillation unit for producing reference pulse; an oscillation unit to be adjusted for producing output pulse; and a self-adjustable logic control unit for receiving the reference pulse and output pulse, and for transmitting a corresponding adjustment signal to the oscillation unit to be adjusted based on the received reference pulse and output pulse to control the oscillation unit to be adjusted to perform the frequency adjustment to the output pulse. The reference pulse required for adjusting the frequency can be generated by the reference oscillation unit integrated on-chip, so that self-adjustment can be achieved on-chip, decrease the cost of the chip compared with off-chip adjustment.

6 Claims, 2 Drawing Sheets

(51) Int. Cl.
*H03K 3/03* (2006.01)
*H03K 3/011* (2006.01)

(56) References Cited

U.S. PATENT DOCUMENTS

2003/0211023 A1  11/2003  Wu et al.
2004/0012449 A1  1/2004   Illegems
2008/0100391 A1  5/2008   Lim et al.
2011/0156760 A1* 6/2011   Bhuiyan ................ H03K 3/011
                                                327/102

FOREIGN PATENT DOCUMENTS

CN   1669221   A   9/2005
CN   201887731  U   6/2011
CN   203039669  U   7/2013
CN   103391045  A   11/2013

* cited by examiner

ANTI PROCESS VARIATION SELF-ADJUSTABLE ON-CHIP OSCILLATOR

CROSS REFERENCE TO RELATED APPLICATION

This application is continuation of International Application No. PCT/CN2014/071614, filed on Jan. 28, 2014, entitled "ANTI-PROCESS FLUCTUATION OF SELF-TRIMMING ON-CHIP OSCILLATOR," which claims priority to Chinese Patent Application No. 201310326307.6, filed on Jul. 30, 2013, all of which are hereby incorporated by reference in their entireties.

FIELD OF THE INVENTION

The present invention relates to integrated circuit, and more particularly, to an anti process variation self-adjustable on-chip oscillator.

BACKGROUND

Low power consumption and high integration level have become the mainstream for future CMOS integrated circuits design, so as to meet the energy saving and small dimension requirements for portable electronic products, wireless sensing network nodes and biochips. The power consumption, the accuracy and the integration level of a clock generator, which serves as an important component of the digital circuits, even of some analog circuits, has been gaining more and more attention.

Crystal oscillator is an oscillator having high precision and high stability. However, it cannot be integrated into the chip, thus increasing application cost and requiring more space. In recent years, with the development of the semiconductor process, on-chip integration of the accurate clock source under standard CMOS process has draw the industry and the academia's attention. Currently, the commonly used on-chip integration of the clock source can be divided into three categories, namely, on-chip integration of LC oscillator, on-chip integration of RC oscillator and on-chip integration of ring oscillator, respectively.

The accuracy and the phase noise performance of the LC oscillator can parallel that of the crystal oscillator. However, since large inductance cannot be fabricated under the standard CMOS process, additional high speed frequency divider is required in order to obtain low oscillation frequency. Thus, the power consumption cannot be achieved less than 100 uW.

The power consumption of RC oscillator is low, and it is suitable for low frequency applications. However, its main problem is that the process discreteness of the on-chip resistors and capacitors fabricated under CMOS process is large, and the output frequency of the RC oscillator will be affected greatly by the process variation, and the frequency variation caused by the process discreteness can reach up to 50% under typical CMOS process.

The ring oscillator can be used for high frequency applications. The accuracy of ring oscillator can be increased significantly via a specific design. It is shown by the simulation data that, in the standard CMOS process, the frequency of ring oscillator having specific structure is less affected by the process variation. When the bias resistor for producing bias current is disposed outside the chip, the variation of the output frequency of ring oscillator introduced by the process variation can be within 2%. A current controlled ring oscillator has been disclosed in a Chinese patent publication No. CN1669221A. The variation of output frequency under different process, voltage, temperature (PVT) conditions can be less than 10%. However, the frequency of such oscillator is high, and the power consumption is large.

Chinese patent publication No. CN1135118A has disclosed a ring oscillator having frequency control ring, for setting the bias current of the on-chip ring oscillator until the frequency of the ring oscillator is consistent with the target frequency. Although accurate oscillation frequency can be obtained by such off-chip adjustment method, but the method for setting the current by using current compensation method is rather complicated, and by using off-chip adjustment, each chip should be additionally adjusted once after manufacturing, causing the cost being increased.

SUMMARY

An anti process variation self-adjustable on-chip oscillator is provided according to the present invention, for solving the above problem of the output frequency of on-chip oscillator being affected significantly by the process variation.

An anti process variation self-adjustable on-chip oscillator includes the following parts integrated on the same chip:

a reference oscillation unit for generating a reference pulse;

an oscillation unit to be adjusted, for generating an output pulse;

a self-adjustable logic control unit for receiving the reference pulse and the output pulse, and for transmitting a corresponding adjustment signal to the oscillation unit to be adjusted based on the received reference pulse and output pulse, and controlling the oscillation unit to be adjusted to adjust the frequency of the output pulse.

The reference oscillation unit can be disposed in the self-adjustable on-chip oscillator of the present invention. The output of the reference oscillation unit can be used as the reference pulse. The adjustment of the output pulse generated by the oscillation unit to be adjusted can be completed under the control of the self-adjustable logic control unit. Thus, the frequency adjustment of output pulse can be performed, wherein the oscillation frequency of the output pulse of the oscillator is made equal to the target oscillation frequency.

The self-adjustable logic control unit can also be used for transmitting the corresponding control signal to the reference oscillation unit based on the received reference pulse and output pulse to turn off or turn on the reference oscillation unit. The reference oscillation unit can be turned off after completing the adjustment for decreasing the power consumption. The reference oscillation unit includes the followings:

a ring oscillator for generating the reference pulse;

a current generator for supplying a bias current to the ring oscillator;

a sleep transistor for receiving the control signal and turning off or turning on the ring oscillator and current generator.

In the reference oscillation unit, a PTAT (proportional to absolute temperature) current generated by the current generator, serves as temperature compensation of the ring oscillator to overcome the temperature drift, causing the output pulse frequency being stable, and the reference oscillation unit can be integrated on-chip, avoiding using the off-chip oscillator for supplying reference pulse. As such, on-chip self adjustment can be realized upon the oscillation unit to be adjusted.

The oscillation unit to be adjusted includes the followings:

a relaxation oscillator for generating an output pulse;

a basic current biasing stage for supplying basic bias current to the relaxation oscillator;

a current biasing array for receiving the adjustment signal, comprising N controllable current biasing stages;

wherein the controllable current biasing stages include control switches, and the control switches turn off or turn on the corresponding controllable current biasing stage based on the received adjustment signal to adjust the frequency of the output pulse.

Low frequency output can be realized by using the oscillation output unit to be adjusted, which is based on the relaxation oscillator. The oscillation output unit to be adjusted is suitable for low frequency application with low power consumption. The basic bias current can be supplied to the relaxation oscillator by the basic current biasing stage, it ensures that the relaxation oscillator has a basic oscillation frequency, and the frequency adjustment of the relaxation oscillator can be implemented by using the current biasing array to allow the frequency being consistent with the target frequency.

The self-adjustable logic control unit includes the followings:

a counter for counting the number of the basic pulses during one or more periods of the output pulse;

an output module for latching the count result, and for assigning values to the adjustment signal and control signal based on the count result;

a delay module for delaying the time at which the output pulse entering the counter;

a power on reset module for initializing the chip when it is powered on.

After the chip (on-chip oscillator) is powered on, the counter and the delay module can be cleared by the power on reset module, and at the same time, the values of the adjustment signal and control signal can be assigned by the output module such that the current biasing array in the unit to be adjusted as well as the basic oscillation unit can be turned on so as to ensure a smooth start up of the self adjustment. Meanwhile, the output pulse is delayed by the delay module for a certain time period, on chip stability can be ensured while counting, and the accuracy of the adjustment can be ensured.

Preferably, the counter is an addition counter formed by N-bit D-flip-flops. The circuit structure is simple and easy to be implemented, and the cost is low.

Preferably, the adjustment signal is N-bit binary digital signal. On-off of N controllable current biasing stages in the oscillation unit to be adjusted can be controlled by N-bit binary digital signal, respectively.

Preferably, the bias current supplied by the N controllable current biasing stages is varied in a stepwise fashion. The gradient of the stepwise variation can be set based on the frequency variation of the relaxation oscillator introduced by the process fluctuation and the reference frequency, when one controllable bias current stage is turned on, the corresponding frequency increment has a stepwise variation with the stepwise variation of the bias current, so that the accuracy of the adjustment can be ensured.

The same value has been taken for the above N.

The self-adjustable procedure of the self-adjustable on-chip oscillator with anti process variation according to the invention is as follows:

Initializing the chip: when power is on, the power-on reset circuit generates a reset signal to initialize the chip, the counter and the delay module will be cleared, the adjustment signal will be set to "1", the current biasing array in the unit to be adjustment will be turned off, the control signal will be set to "0", the reference oscillation unit will be turned on, and the adjustment procedure will be prepared.

Counting: after the chip is initialized, the output pulse delayed by the delay module can input to the counter to start counting, the counting can be implemented by using the reference pulse during one or more oscillation periods of the output pulse, and the counting will stop after one or more oscillation periods of the output pulse.

Latching: after completing the counting, the counting result can be latched in the output unit until the chip is powered on again.

Signal assigning: after completing the counting, the adjustment signal values can be assigned by the output unit based on the counting result, the frequency of the output pulse can be adjusted by the current biasing array, meanwhile, "1" will be set for the control signal by the output unit, and the reference oscillation unit will be turned off by the sleep transistor.

The deviation of the frequency of the output pulse introduced by the process variation can be decreased by using the anti process variation self-adjustable on-chip oscillator provided according to the present invention. The required reference pulse for adjusting the frequency can be provided by the reference oscillation unit integrated on-chip, and the reference oscillation unit can be turned off after completing the adjustment, self adjustment of the output frequency can be implemented on-chip, the discretization of the output frequency of the oscillator to be adjusted under different process corners has been decreased from 30% to 6% before and after adjustment, which is beneficial for reducing the cost. Also, the structure of the hardware is simple and easy to be implemented. After finishing the adjustment, the reference oscillation unit will be turned off, which is beneficial for reducing the power consumption of the chip.

DETAILED DESCRIPTION

The anti process variation self-adjustable on-chip oscillator of the invention will now be further described in detail in connection with the detailed embodiment.

Figure 1:
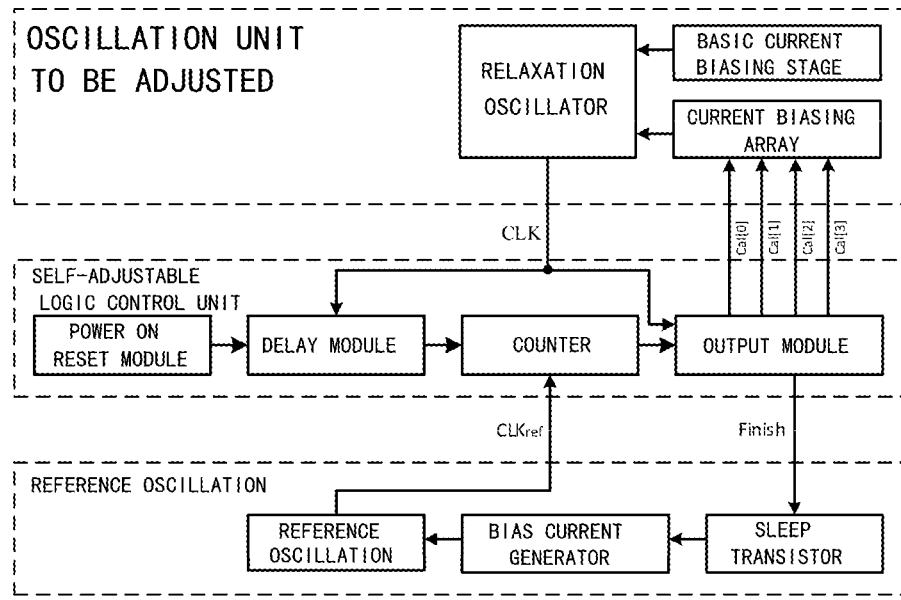
FIG. 1 is a structure block diagram of the anti process variation self-adjustable on-chip oscillator according to the present invention.

As shown in FIG. 1, an anti process variation self-adjustable on-chip oscillator includes the following components which are integrated on the same chip:

a reference oscillation unit for generating a reference pulse, the reference oscillation unit including:

a ring oscillator for generating the reference pulse;

a current generator for supplying a bias current to the ring oscillator;

a sleep transistor for turning off or turning on the ring oscillator and current generator;

an oscillation unit to be adjusted for generating an output pulse, includes:

a relaxation oscillator for producing the output pulse;

a basic current biasing stage for supplying basic bias current to the relaxation oscillator;

a current biasing array for receiving the adjustment signal, comprising four controllable current biasing stages. The control switches are disposed on the signal receiving terminals of each of the controllable current biasing stages, and the corresponding controllable current biasing stage can be turned off or turned on based on the received adjustment signal to adjust the frequency of the output pulse. The output current of the four controllable current biasing stages is varied in a stepwise fashion;

a self-adjustable logic control unit for receiving the reference pulse and the output pulse, and corresponding adjustment signals can be transmitted to the current biasing array of the oscillation unit to be adjusted based on the received reference pulse and the output pulse, respectively, and the control signal can be transmitted to the sleep transistor of the reference oscillation unit, comprising:

a counter for counting the number of the reference pulses during one or more output pulse periods, it is a mode 16 adding counter formed by 4-bit D-flip-flop.

an output module for latching the counting result, and assigning the values of the adjustment signal and the control signal based on the counting result;

a power on reset module for initializing the chip when the chip is powered on;

a delay module for delaying the time at which the output pulse inputting to the counter to ensure that the power supply is stable when the counter performs counting.

Figure 2:
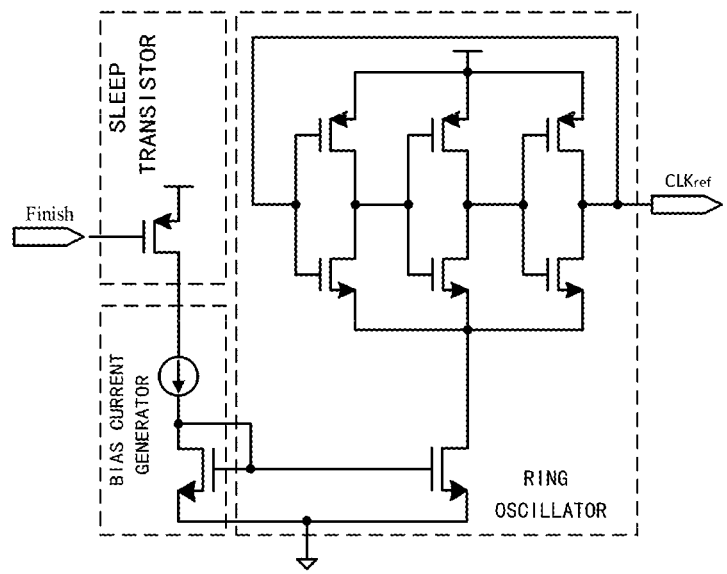
FIG. 2 is a circuit principle diagram of the reference oscillation unit according to one embodiment.
Figure 3:
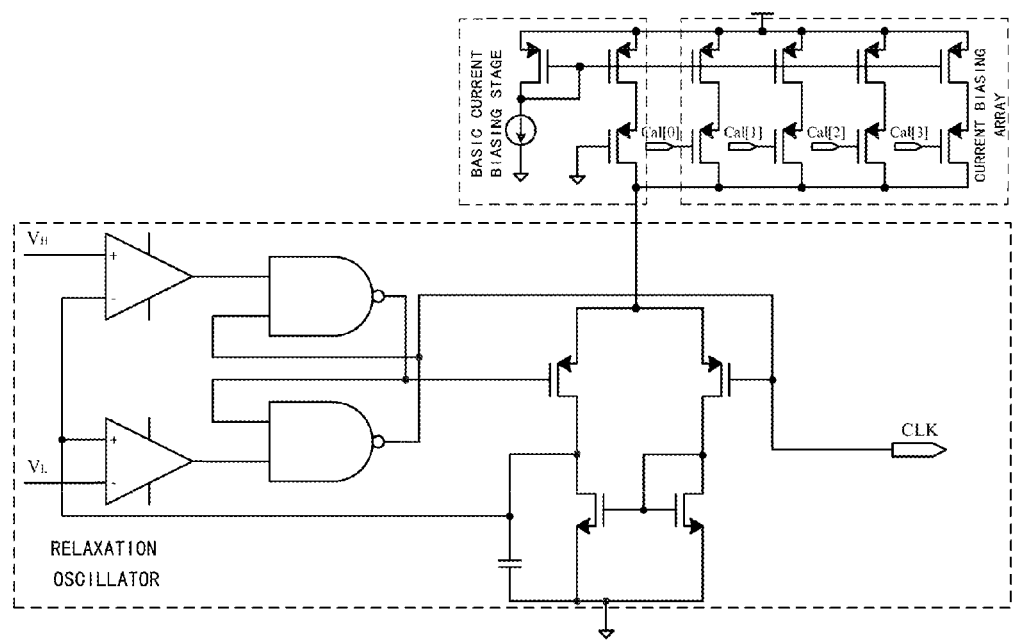
FIG. 3 is a circuit principle diagram of the oscillation unit to be adjusted according to one embodiment.

In one embodiment, the circuit diagrams of the reference oscillation unit and the oscillation unit to be adjusted are shown as FIG. 2 and FIG. 3, respectively, wherein $V_H$ and $V_L$ in FIG. 3 is high voltage level and low voltage level, for deciding the output frequency of the relaxation oscillator to a certain extent, it can be configured flexibly as required in the practical application, they can be $V_H=3V$ and $V_L=1V$ in the embodiment, respectively.

The self-adjustable procedure of the self-adjustable on-chip oscillator in the embodiment will now be described in detail as follows, wherein it is assumed that the target frequency of the output pulse of the oscillator chip is $f_0$, the frequency of the reference pulse $CLK_{ref}$ is 64 $f_0$, the frequency of the output pulse CLK of the relaxation oscillator before adjusting is $f=64/67 f_0$, less than the target frequency, and the frequency deviation of the relaxation oscillator introduced by the process variation is less than 20% It is assumed that the control signal is Finish, the adjustment signal is Cal[0:3], when Cal [n]=0(n=0 . . . 3), the corresponding current stage is turned on, the frequency of the output pulse of the oscillator will be increased with respect to the frequency of the out pulse before adjustment and consistent with the formula $2^n/64$.

Initializing the chip: When power is on, the power-on reset circuit generates a reset signal to initialize the chip. The counter and the delay circuit will be cleared, the adjustment signal will be set to "" and the control signal will be set to "0", that is, Cal[0:3]=1111, Finish=0. All the branches of the biasing current array are turned on and the reference oscillation unit is turned off. Counting: after the chip is initialized, the output pulse can be inputted to the counter after delaying by the delay module for 5 ms, counting will be implemented by using the reference pulse during one oscillation period of the output pulse, and the counting will stop after one output pulse period. The counting result of the counter is 0011 in the embodiment, the counter overflows 4 times.

Latching: after completing the counting, the counting result 0011 can be latched in the output unit.

Signal assigning: the value of the adjustment signal will be assigned by the output unit based on the counting result latched by the output unit, so that Cal[0:3]=0011, the controllable current biasing stages corresponding to Cal[0] and Cal [1] in the current biasing array will be turned on, and the frequency adjustment of the output pulse can be completed, the frequency of output pulse will be increased to reach the target frequency $f_0$. At the same time, the control signal can be set to "1" by the output unit, that is, Finish=1, the sleep transistor will be turned off, the ring oscillator and the current generator will be powered off and turned off.

If it does not power on again, then the operating state of the current biasing array in the on-chip oscillator will maintain unchanged, thereby the frequency of the output pulse will not change until the chip being powered on next time to initialize again.

The foregoing is merely preferred embodiments of the present invention, which shall not be construed as limitation to the scope of protection of the present invention. Any modification, equivalent, improvement, etc., made within the spirit and principle of the present invention shall fall with in the scope of protection of the present invention.

What is claimed is:

1. An anti process variation self-adjustable on-chip oscillator, comprising the following components integrated on a same chip:

a reference oscillation unit configured to generate a reference pulse;

an oscillation unit to be adjusted configured to generate an output pulse;

a self-adjustable logic control unit configured to receive the reference pulse and the output pulse, and to transmit an adjustment signal to the oscillation unit to be adjusted based on the received reference pulse and the output pulse, and to control the oscillation unit to be adjusted to perform the frequency adjustment to the outpost pulse, wherein the self-adjustable logic control unit is further configured to transmit a control signal to the reference oscillation unit based on the received reference pulse and the output pulse to turn off or turn on the reference oscillation unit; and the reference oscillation unit comprises:

a ring oscillator configured to generate the reference pulse, a current generator configured to supply a bias current to the ring oscillator, and a sleep transistor configured to receive the control signal and to turn off or turn on the ring oscillator and the current generator.

2. The anti process variation self-adjustable on-chip oscillator of claim 1, wherein the oscillation unit to be adjusted comprises:

a relaxation oscillator, configured to generate an output pulse;

a basic current biasing stage, configured to supply a basic bias current to the relaxation oscillator; and a current biasing array configured to receive the adjustment signal, wherein the current biasing array comprises N controllable current biasing stages, wherein the controllable current biasing stages and the corresponding controllable current biasing stage are turned off or turned on based on the received adjustment signal to perform the frequency adjustment to the output pulse.

3. The anti process variation self-adjustable on-chip oscillator of claim 2, wherein the self-adjustable logic control unit comprises:

a counter configured to count the number of the basic pulses during one or more periods of the output pulse;

an output module configured to latch the counting result, and to assign values to the adjustment signal and control signal based on the counting result;

a delay module configured to delay the time at which the output pulse entering the counter; and a power on reset module configured to initialize the chip when it is powered on.

4. The anti process variation self-adjustable on-chip oscillator of claim 3, wherein the counter is an addition counter formed by N-bit D flip-flops.

5. The anti process variation self-adjustable on-chip oscillator of claim 2, wherein the adjustment signal is N-bit binary digital signal for controlling the on and off of the N controllable current biasing stages in the oscillation unit to be adjustment, respectively.

6. The anti process variation self-adjustable on-chip oscillator of claim 5, wherein the bias current supplied by the N controllable current biasing stages is varied in a stepwise fashion.

* * * * *